(12) United States Patent
Komatsuda (10) Patent No.: US 7,023,523 B2
(45) Date of Patent: Apr. 4, 2006

(54) EXPOSURE SYSTEM AND EXPOSURE METHOD

(75) Inventor: Hideki Komatsuda, Ageo (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 11/177,141

(22) Filed: Jul. 7, 2005

(65) Prior Publication Data

US 2005/0264789 A1   Dec. 1, 2005

Related U.S. Application Data (63) Continuation of application No. PCT/JP2004/000129, filed on Jan. 9, 2004.

(30) Foreign Application Priority Data

Jan. 10, 2003   (JP)   ............................. 2003-003868

(51) Int. Cl.
    *G03B 27/42* (2006.01)
(52) U.S. Cl. ............................ 355/53; 355/63; 355/71; 250/492.2; 250/548
(58) Field of Classification Search .................... None
    See application file for complete search history.

(56) References Cited

U.S. PATENT DOCUMENTS

| | | | | |
|---|---|---|---|---|
| 5,583,609 A | * | 12/1996 | Mizutani et al. | 250/548 |
| 5,719,617 A | * | 2/1998 | Takahashi et al. | 355/70 |
| 6,509,954 B1 | * | 1/2003 | Tanaka et al. | 355/53 |
| 6,526,118 B1 | * | 2/2003 | Komatsuda et al. | 378/34 |

FOREIGN PATENT DOCUMENTS

| | | |
|---|---|---|
| EP | 0985976 A2 | 3/2000 |
| JP | 07-283116 A | 10/1995 |
| JP | 07283116 * | 10/1995 |
| JP | 09-246152 A | 9/1997 |
| JP | 09246152 * | 9/1997 |
| JP | 2000-286191 * | 10/2000 |
| JP | 2000-286191 A | 10/2000 |

* cited by examiner

*Primary Examiner*—D. Rutledge
(74) *Attorney, Agent, or Firm*—Klarquist Sparkman LLP (57) ABSTRACT

Exposure systems are disclosed having a configuration in which a field stop is positioned in proximity to a reflection-type mask, but that satisfactorily minimize adverse effects on the image-forming performance of the projection-optical system. The systems transfer a mask pattern accurately and with high throughput onto a photosensitive substrate. The system comprises an illumination-optical system (1, 2) that illuminates a reflection-type mask (M) on which is formed a prescribed pattern. A projection-optical system forms an image of the mask pattern on the photosensitive substrate (W). The mask and substrate are moved in a prescribed direction relative to the projection-optical system to project the mask pattern onto and expose the photosensitive substrate. The illumination-optical system has a field stop (19), positioned in proximity to the mask, that defines the illumination area on the mask. The interval between the mask and the field stop satisfies a prescribed conditional relation.

6 Claims, 5 Drawing Sheets

FIG. 6

EXPOSURE SYSTEM AND EXPOSURE METHOD

CROSS REFERENCE TO RELATED APPLICATION

This application is a continuation of, and claims priority to and the benefit of, PCT Application No. PCT/JP2004/000129, filed Jan. 9, 2004, which was published as International Publication No. WO 2004/064128 A1 on Jul. 29, 2004, both incorporated herein in their respective entirety.

FIELD

This invention relates to exposure systems and exposure methods, and in particular relates to exposure systems that are suitable for manufacturing of semiconductor devices and other microdevices using photolithography processes employing extreme ultraviolet (EUV) light having a wavelength of approximately 5 to 40 nm.

BACKGROUND

Accompanying the increasingly fine detail of circuit patterns to be projected in semiconductor fabrication, ever-higher resolution levels are being demanded from lithography exposure systems. As a result, light of shorter wavelengths is being used as the exposure light. In this specification, "light" is used not merely in the narrow sense of visible light, but rather has the broader meaning of "light" that includes electromagnetic radiation extending from so-called infrared rays to X rays, and having wavelengths shorter than 1 mm. In recent years, exposure systems have been proposed as next-generation lithography systems that use EUV (Extreme Ultraviolet) light with wavelengths of approximately 5 to 40 nm (hereinafter such systems are called "Extreme Ultraviolet Lithography exposure systems" or "EUVL exposure systems").

In the extremely short wavelength range of EUV light, no materials are known that have sufficient transmissivity for use as refracting optical members. Consequently, a reflection-type projection-optical system, comprising only reflecting optical members, must be employed. In an EUVL exposure system, a reflection-type mask is used rather than a transmission-type mask, which requires that the illumination light be made incident obliquely to the mask. If the illumination light were made normally incident to a reflection-type mask, the optical path of the illumination light incident on the mask and the optical path of the illumination light reflected by the mask and propagating toward a projection-optical system would completely overlap. As a result, either the optical members of the illumination-optical system for illuminating the mask would block the optical path of the projection-optical system, or the optical members of the projection-optical system would block the optical path of the illumination-optical system.

In an EUVL exposure system, only a narrow arc-shaped effective exposure area (i.e., stationary exposure area) can be obtained using a reflection-type projection-optical system. Consequently, the mask and photosensitive substrate (wafer or analogous object) must be moved relative to the projection-optical system to scan the exposure light along the mask pattern over the photosensitive substrate (this is called "scanning exposure"). A field stop used for defining the stationary exposure area must be placed at a position that is substantially optically conjugate with the photosensitive substrate. In conventional EUVL exposure systems, a field stop is provided in the optical path of the illumination-optical system. By inserting an image-forming reflective optical system between the mask and the field stop, the field stop and the mask (and the photosensitive substrate) are placed in optically conjugate positions.

In general, the reflectivity per reflection surface is low in an EUVL exposure system. As a result, from the standpoint of avoiding loss of light, which reduces throughput, the number of reflections in the optical system between the light source and the photosensitive substrate (that is, in the illumination-optical system and in the projection-optical system) must be as few as possible. In conventional EUVL exposure systems, an image-forming reflective optical system is situated between the mask and the field stop as explained above. The resulting high number of reflections in the optical path of the illumination-optical system results in substantial loss of light, which prevents achievement of the necessary throughput.

To reduce the number of reflections in the optical path of the illumination-optical system and achieve the necessary throughput, a configuration may be adopted in which the field stop is positioned in proximity to the reflection-type mask. However, simply positioning the field stop in proximity to the reflection-type mask would cause a portion of the necessary radiation flux to be blocked by the field stop, with an adverse effect on the image-forming performance of the projection-optical system. This situation would raise the possibility that the mask pattern could not be transferred, accurately and without distortion, onto the photosensitive substrate.

SUMMARY

This invention was devised in light of the above-described problems, and has an object of providing an exposure system and exposure method that are capable of transferring a mask pattern onto a photosensitive substrate accurately and with high throughput, while satisfactorily controlling adverse effects, on the image-forming performance of the projection-optical system, despite the use of a field stop in proximity to the reflection-type mask.

In order to achieve the above-noted object, and according to a first aspect of the invention, an exposure system is provided that comprises an illumination-optical system to illuminate a reflection-type mask on which is formed a prescribed pattern. The exposure system also comprises a projection-optical system to form an image of the mask pattern on a photosensitive substrate. The mask and the photosensitive substrate are moved relative to the projection-optical system in a prescribed direction to project the mask pattern onto and expose the photosensitive substrate. The exposure system is characterized in that the illumination-optical system has a field stop, positioned in proximity to the mask, to define the illumination area on the mask. If the interval between the mask and the field stop is $i_n$, the numerical aperture on the mask side of the projection-optical system is NA, the width dimension of the aperture portion of the field stop along the prescribed direction is w, and the angle of incidence (in radians) on the mask of the principal ray of the illumination light illuminating the mask is $a_n$, then the following condition is satisfied:

$$i_n < 0.5 \times w/(2 \times NA + a_n)$$

According to a second aspect of the invention, an exposure method is provided that comprises an illumination step in which a reflection-type mask, on which is formed a prescribed pattern, is illuminated. In an exposure step the mask and the photosensitive substrate are moved relative to the projection-optical system in a prescribed direction to project the mask pattern onto and expose the photosensitive substrate. The exposure method is characterized in that the illumination step comprises an illumination-area-definition step in which the illumination area on the mask is defined by using a field stop that is positioned in proximity to the mask. In the illumination-area-definition step, if the interval between the mask and the field stop is $i_n$, the numerical aperture on the mask side of the projection-optical system is NA, the width dimension of the aperture portion of the field stop along the prescribed direction is w, and the angle of incidence (in radians) on the mask of the principal ray of the illumination light illuminating the mask is $a_n$, then the following condition is satisfied:

$$i_n < 0.5 \times w/(2 \times NA + a_n)$$

DETAILED DESCRIPTION OF PREFERRED EMBODIMENTS

Figure 1:
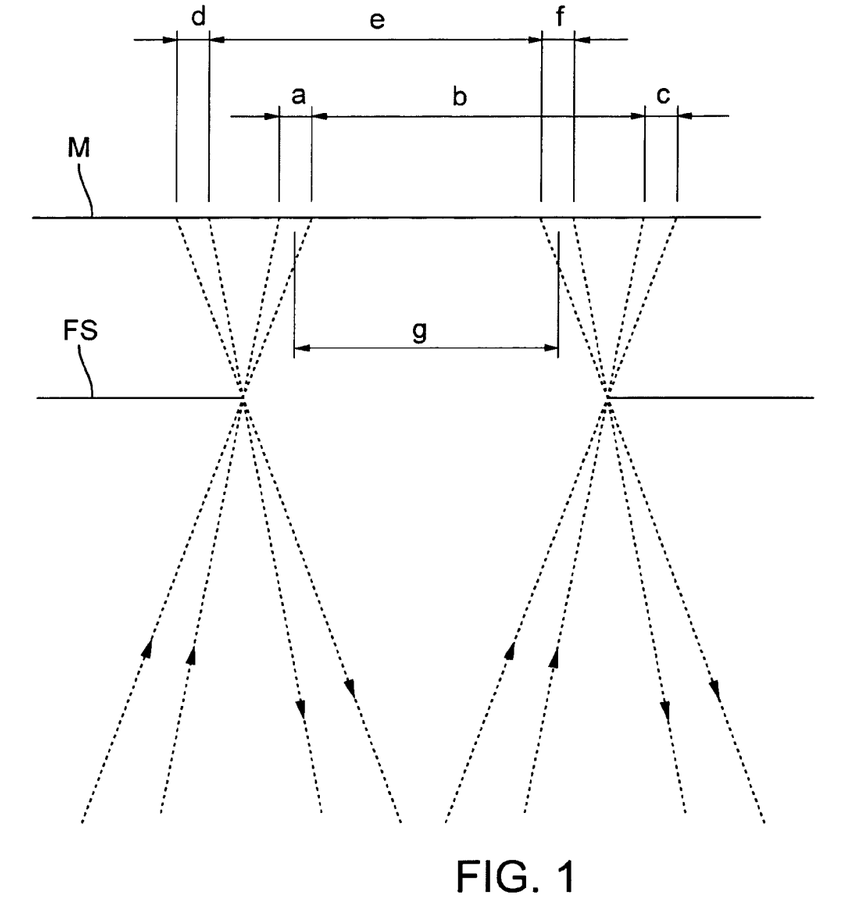
FIG. 1 explains a difficulty occurring in a configuration in which a field stop is positioned in proximity to a reflection-type mask.

FIG. 1 explains a difficulty occurring in a configuration in which a field stop FS is positioned in proximity to a reflection-type mask M. In FIG. 1, when radiation flux having numerical aperture $NA_{ill}$ is incident on the mask M through the field stop FS, the flux incident on the area "b" on the mask M is not blocked at all by the field stop FS. However, the flux incident on the areas "a" and "c" on either side of the area "b" is partially blocked by the field stop FS. Blocking of the radiation flux incident on the areas "a" and "c" by the field stop FS increases substantially as the outer edge of the areas "a" and "c" is approached.

Seen from the projection-optical system (not shown in FIG. 1), the radiation flux from the area "e" on the mask M, as incident on the projection-optical system having a numerical aperture $NA_{pro}$ on the mask side (object side), is not blocked at all by the field stop FS. However, radiation flux incident on the projection-optical system from the areas "d" and "f" on either side of the area "e" is partially blocked by the field stop FS. The extent of blocking, by the field stop FS, of flux from the areas "d" and "f" on either side increases substantially as the outer edge of the areas "d" and "f" is approached. In this case, as is clear from FIG. 1, the image-forming radiation flux contributing to exposure through the projection-optical system is flux that is incident on and reflected by the area on the mask M in which the area "b" and the area "e" overlap, and on the areas "a" and "f".

As stated above, radiation flux incident on and reflected by the areas "a" and "f" is partially blocked by the field stop FS. Hence, even if the required extended source were formed at the exit pupil of the illumination-optical system, the image of the extended source formed at the entrance pupil of the projection-optical system would be partially missing, which produces adverse effects on the image-forming performance of the projection-optical system. In particular, in the area of image formation on the photosensitive substrate by radiation flux reflected by the area "f", the resolution is different from that for other image-forming areas. It is expected that this would have a considerable effect on the uniformity of the mask-pattern image formed on the photosensitive substrate.

The most important practical problem in transfer-exposing a pattern using an optical-system configuration in which a field stop is positioned in proximity to a reflection-type mask is not the width of a dense line pattern, but rather the width of independent lines of the pattern. Dense-line patterns are frequently used in memory circuits; but, because the main concern is whether or not lines are connected to each other, variation in line-widths is not typically an important problem. In logic circuits, on the other hand, there are almost no dense patterns of lines arranged at equal intervals; rather, independent lines are randomly arranged within an area of the pattern. Variations in line-widths in such cases tend to cause local irregularities in the speed of information transmission in the device. In the worst case the device may not function properly.

In general, in finished devices, the acceptable tolerance for variation in the line-widths of independent lines is approximately 10% of these designed line-widths to ensure reliable operation. To hold this tolerance to within 10%, line-width variations arising from the exposure system must be kept to 3% or less. To hold line-width variation arising from the exposure system itself to within 3%, the line-width variation arising from the field stop must be held to within, at most, 1%.

In FIG. 1, the image-forming radiation flux contributing to exposure through the projection-optical system is flux that has been incident on and reflected from the area of overlap on the mask M of areas "b" and "e," and from the areas "a" and "f". Of these, only the radiation flux incident on and reflected from the area of overlap of areas "b" and "e" enables exposure by means of normal image formation through the projection-optical system. The radiation flux incident on and reflected from the area "f" has the greatest adverse influence on image formation through the projection-optical system. Hence, one criterion for satisfactorily controlling the effect on image-forming performance of the projection-optical system is the extent to which the width of the area "f" can be reduced relative to the interval "g" between the center of area "a" and the center of area "f" in FIG. 1. I.e., the width "g" of the effective illumination area optically corresponds to the width (the dimension along the scan direction) of the effective exposure area.

The extent of the adverse effect on the image-forming performance of the projection-optical system of radiation flux incident on and reflected by the area "f" depends on the image-side numerical aperture $NA_i$ of the projection-optical system, the pattern line-width, the wavelength λ of the illumination light (exposure light), etc., and is determined by a value indicating the range within which the projection-optical system can collect the refracted light of the image, i.e., the value of what is commonly known as the $k_1$ factor. The $k_1$ factor is defined by the following equation (1).

$$k_1=(\text{pattern line-width}) \times NA_i/\lambda \quad (1)$$

In general, in an EUVL exposure system, a $k_1$ factor of approximately 0.4 is anticipated. Upon performing an image-formation simulation described below with $k_1=0.4$, it was found that, in order to control the variation in line-width of independent lines to within 1%, the ratio of the width of the area "f" to the width "g" of the effective illumination area must satisfy the following conditional relation (2).

$$(\text{width of area ``}f\text{''})/(\text{width ``}g\text{'' of effective illumination area}) < \tfrac{1}{2} \quad (2)$$

If the interval between the mask and the field stop is $i_n$, the numerical aperture on the mask side of the projection-optical system is NA, the width along the scan direction of the aperture portion of the field stop is w, and the angle of incidence (in radians) on the mask of the principal ray of illumination light illuminating the mask is $a_n$, then the width of the area "f" and the width "g" of the effective illumination area are respectively represented by the following equations (3) and (4).

$$\text{width of area ``}f\text{''}=2NA \times i_n \quad (3)$$

$$\text{width ``}g\text{'' of effective illumination area}=w-2i_n a_n \quad (4)$$

Substituting the relations of equations (3) and (4) into the conditional relation (2), the conditional relation (2) can be modified to obtain the following conditional relation (5).

$$i_n < 0.5 \times w/(2NA+a_n) \quad (5)$$

In order to still more effectively suppress variation in the line-widths of independent lines, it is preferred that the upper limit (right-hand value) of conditional relation (2) be ¼. In this case, the following conditional relation (6) is obtained as corresponding to the conditional relation (5).

$$i_n < 0.5 \times w/(4NA+a_n) \quad (6)$$

Figure 2A:
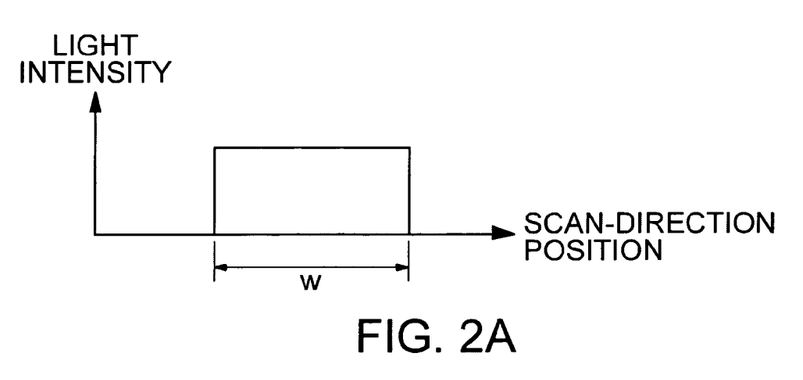
FIG. 2A shows the light-intensity distribution obtained on a mask whenever a field stop is brought into close contact with a mask.

The field stop (the aperture portion of which is of width w in the scan direction) is placed in close contact with the mask, with the interval $i_n$ set to 0, then as shown in FIG. 2A, a uniform distribution of light intensity is obtained across the area on the mask of width w in the scan direction. In this case, in order to render uniform the distribution of the cumulative exposure dose on the photosensitive substrate, an integral multiple of the amount of scanning movement of the mask corresponding to a single light-source pulse must be made to coincide with the width w in the scan direction of the illumination area on the mask. In other words, if an integral multiple of the amount of mask-scanning movement per light pulse does not exactly coincide with the width w, then a uniform distribution of cumulative exposure dose on the photosensitive substrate cannot be obtained.

Figure 2B:
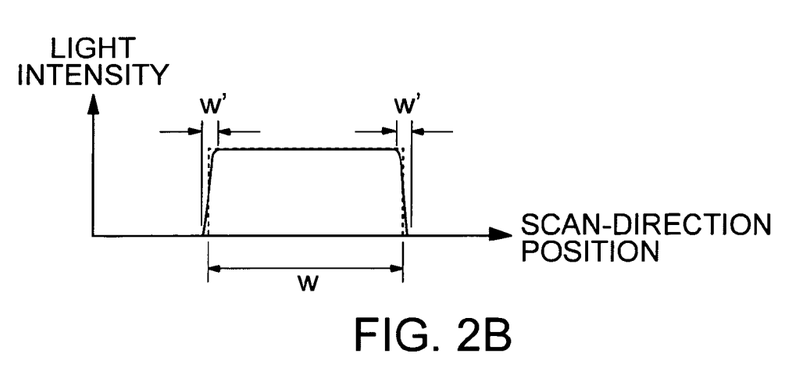
FIG. 2B shows the light-intensity distribution obtained on a mask whenever the field stop is moved slightly away from the mask.

In actual practice, to avoid mechanical interference between the mask and the field stop, the field stop is displaced slightly from the mask. In this case, as shown in FIG. 2B, the distribution of light intensity on the mask in the scan direction is uniform in the center area, but there is a gradual change in light intensity in flanking regions. As explained above, this is because the radiation flux incident on the area "b" on the mask M is not blocked by the field stop FS, but the flux incident on the areas "a" and "c" on either side of area "b" is partially blocked by the field stop FS.

If, in the distribution of light intensity on the mask in the scan direction, areas exist on both sides in which the light intensity changes gradually, then advantageously even if an integral multiple of the amount of mask-scan movement per light pulse is not made to coincide exactly with the width w in the scan direction of the illumination area on the mask, a substantially uniform distribution of cumulative exposure dose on the photosensitive substrate can be obtained. To this end, it is preferable that the width w' in the scan direction of one side area in which the light intensity changes gradually be greater than 1% of the width w in the scan direction of the illumination area. I.e., it is preferable that the following equation (9a) be satisfied.

$$w/100 < w' \quad (9a)$$

In the distribution of light intensity on the mask in the scanning direction, the width w' of one region in which the light intensity changes gradually is given by the following equation (9b).

$$w'=NA \times i_n \times 2 \quad (9b)$$

From equations (9a) and (9b), to obtain a substantially uniform distribution of cumulative exposure dose on the photosensitive substrate, even when an integral multiple of the amount of mask-scan movement per light pulse does not exactly coincide with the width w in the scan direction of the illumination area on the mask, it is preferable that the interval $i_n$ between the mask and the field stop satisfy the following conditional relation (9).

$$w/(200NA) < i_n \quad (9)$$

Below, the equations used in image-formation simulations are briefly explained. The diffracted light amplitude $D(\xi,\eta)$ at the entrance pupil of the projection-optical system is given by equation (7) below. In equation (7) $(\xi,\eta)$ are coordinates on the entrance pupil of the projection-optical system, and (x,y) are coordinates on the mask; M(x,y) is the mask-amplitude transmissivity, k is a constant represented by $2\pi/\lambda$, and $\iint$ indicates a double integral evaluated over the field of the mask.

$$D(\xi,\eta) = \iint_{field} M(x,y)\exp\{-ik(\xi x + \eta y)\}\,dx\,dy \quad (7)$$

Further, the light-intensity distribution I(X,Y) on the photosensitive substrate is expressed by the following equation (8). In equation (8), (X,Y) are coordinates on the photosensitive substrate, $(\delta,\epsilon)$ are coordinates on the effective extended source formed at the exit pupil of the illumination system, $U(\delta,\epsilon)$ is the light-intensity distribution of the extended source, $\beta(\delta,\epsilon,x,y)$ is the image-forming magnification at the entrance pupil of the projection-optical system from the extended source, $W(\xi,\eta,X,Y)$ is the wavefront of the projection-optical system, the first occurrence of $\iint$ represents a double integral over the extended source, and the second occurrence of $\iint$ represents a double integral over the image-side numerical aperture NA of the projection-optical system.

$$I(X,Y) = \iint_{extended\ source} U(\delta,\varepsilon) \left| \iint_{NA} D(\xi-\beta\delta,\eta-\beta\varepsilon) \times \exp\{ik(\xi X + \eta Y + W)\}\,d\xi\,d\eta \right|^2 d\delta\,d\varepsilon \quad (8)$$

In this invention, a configuration is adopted in which a field stop used for defining the illumination area on the mask is positioned in proximity to the mask. But, because the interval $i_n$ between the mask and the field stop is set so as to satisfy conditional relations (5) or (6), any adverse effect of the blockage of light by the field stop on the image-forming performance of the projection-optical system can be satisfactorily minimized. Further, a configuration is adopted in which the field stop is positioned in proximity to the mask, so that there is no need to insert an image-forming reflective optical system between the mask and field stop. Also, the number of reflections in the optical path of the illumination-optical system can be decreased, thereby reducing optical losses and achieving the necessary throughput. It is preferable that the interval $i_n$ between the mask and field stop satisfy the conditional relation (9). In such a configuration, even if an integral multiple of the amount of mask-scan movement per light pulse does not exactly coincide with the width w in the scan direction of the illumination area on the mask, a substantially uniform distribution of cumulative exposure dose on the photosensitive substrate can be obtained.

Thus, in the exposure system and exposure method of this invention, despite a configuration in which the field stop is positioned in proximity to the reflection-type mask, any adverse effect on the image-forming performance of the projection-optical system can be satisfactorily minimized, the mask pattern can be transferred onto the photosensitive substrate accurately and with high throughput, and finely detailed microdevices can be manufactured with high throughput.

Another aspect of the invention is explained, referring to the attached drawings.

Figure 3:
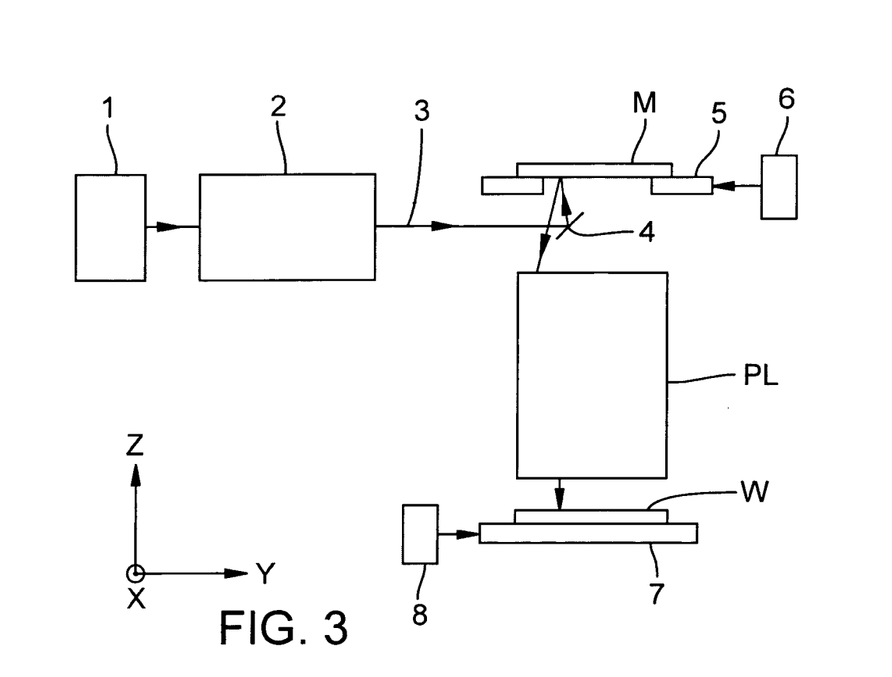
FIG. 3 shows in summary the configuration of the exposure system of an aspect of the invention.
Figure 4:
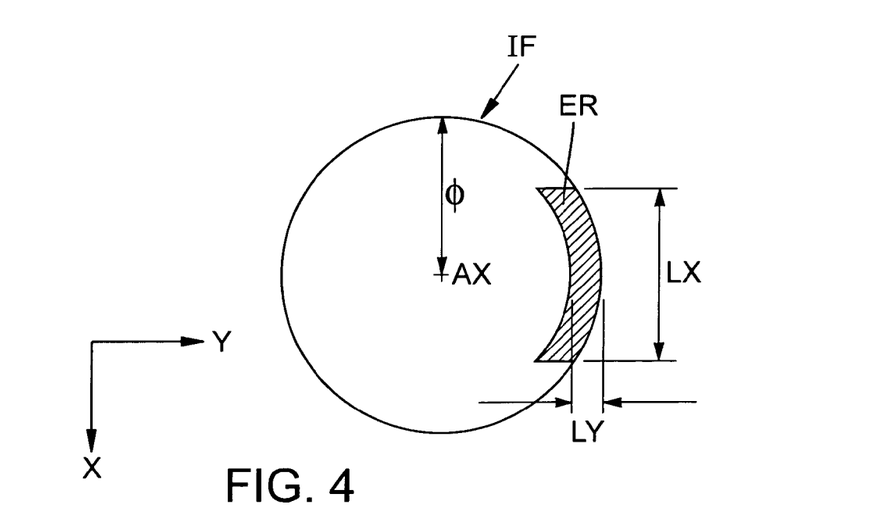
FIG. 4 shows the positional relation between an arc-shaped exposure area (i.e., the effective exposure area) formed on the wafer, and the optical axis.
Figure 5:
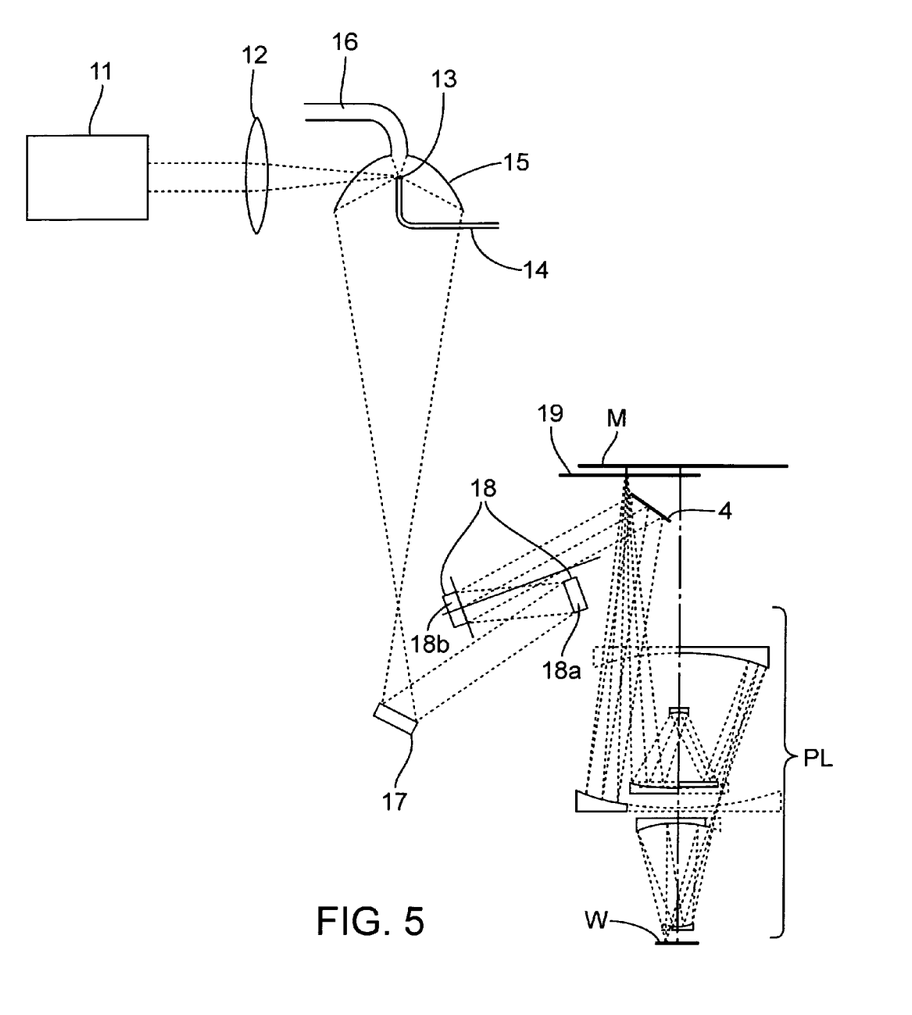
FIG. 5 shows in summary the internal configuration of the light source and illumination-optical system of FIG. 3.

FIG. 3 shows in summary the overall configuration of the exposure system of an aspect of the invention. FIG. 4 shows the positional relation between an arc-shape exposure area (that is, the effective exposure area) formed on the wafer, and the optical axis. FIG. 5 shows in summary the internal configuration of the light source and illumination-optical system of FIG. 3. In FIG. 3 the Z-axis is in the optical-axis direction of the projection-optical system, i.e., along the normal direction of the wafer (photosensitive substrate). The Y-axis is set in a direction in the wafer plane, parallel to the plane of the paper in FIG. 3, and the X-axis is set in a direction in the wafer plane, in the direction perpendicular to the plane of the paper in FIG. 3.

The exposure system of FIG. 3 comprises, for example, a laser plasma light source 1, used as a source of exposure light. Light emitted from the light source 1 passes through a wavelength-selective filter (not shown) and is incident on the illumination-optical system 2. The wavelength-selective filter selects and transmits only EUV light of a prescribed wavelength (for example, 13.4 nm or 11.5 nm) from among the light supplied by the light source 1, and blocks light of other wavelengths. After passing through the wavelength-selective filter, the EUV light 3 traverses the illumination-optical system 2 and reflects from a planar reflecting mirror 4 (serving as an optical-path-deflecting mirror) to illuminate the reflection-type mask (reticle) M on which the pattern to be transferred is formed. The mask M is held by a mask stage 5, movable in the Y-axis direction, with the pattern plane extending in the XY plane. Movement of the mask stage 5 is measured by a laser interferometer 6.

Light from the pattern of the illuminated mask M traverses the reflection-type projection-optical system PL to form an image of the mask pattern on the wafer W, which is the photosensitive substrate. FIG. 4 shows a long, thin arc-shaped exposure area (stationary exposure area that, for example, is symmetrical about the Y axis) formed on the wafer W. In the circular area (image circle) IF centered on the optical axis AX and having a radius ϕ, an arc-shaped effective illumination area ER is defined having an X-direction length LX and a Y-direction width LY. The illumination area ER extends partly along the circumference of the image circle IF.

The wafer W is held by a wafer stage 7, which is movable in two dimensions along the X and Y directions, so that the exposure surface extends in the XY plane. As the mask stage 5, movement of the wafer stage 7 is measured by a laser interferometer 8. Thus, by performing scanning exposure while moving the mask stage 5 and the wafer stage 7 in the Y direction, i.e., while moving the mask M and wafer W in the Y direction relative to the projection-optical system PL, the pattern of the mask M is transferred to a single exposure area of the wafer W.

If the projection magnification (transfer magnification) of the projection-optical system PL is ¼, for example, then the movement velocity of the wafer stage 7 is set to ¼ the movement velocity of the mask stage 5 during synchronous scanning. By repeating the scanning exposure while moving the wafer stage 7 in two dimensions along the X- and Y-axis directions, the pattern of the mask M is transferred to each of the exposure areas of the wafer W.

Referring to FIG. 5, in a laser plasma light source 1, light (non-EUV light) emitted from the laser light source 11 passes through a focusing lens 12 and is focused on a gas target 13. Here, the gas target is high-pressure xenon (Xe), for example, which is supplied from a nozzle 14, wherein the gas discharged from the nozzle 14 forms the gas target 13. The gas target 13 absorbs energy from the focused laser light and forms a plasma that emits EUV light. The gas target 13 is positioned at a first focal point of an elliptical reflecting mirror 15 while the EUV light radiated by the laser plasma light source 1 is focused at the second focal point of the elliptical reflecting mirror 15. Gas that has emitted radiation is evacuated to the outside through a duct 16.

EUV light focused at the second focal point of the elliptical reflecting mirror 15 traverses a concave reflecting mirror 17 to become a substantially parallel radiation flux that is guided to an optical integrator 18 comprising a pair of fly-eye mirrors 18a, 18b. By way of example, the pair of fly-eye mirrors 18a, 18b can be the fly-eye mirrors disclosed in the current Applicant's Japan Kôkai Patent Document No. Hei 11-312638, incorporated herein by reference.

Thus, an effective extended source having a prescribed shape is formed in the vicinity of the opposing plane of the second fly-eye mirror 18b, i.e., in the vicinity of the exit plane of the optical integrator 18. As explained above, the effective extended source is formed at the position of, or in the vicinity of, the exit pupil of the illumination-optical system 2, i.e., in the plane of, or in the vicinity of, the plane that is optically conjugate with the entrance pupil of the projection-optical system PL. Light from the effective extended source is deflected by the planar reflecting mirror 4, traverses the field stop 19 positioned substantially parallel to and in proximity to the mask M, and forms a long thin arc-shaped illumination area on the mask M. Light from the pattern of the illuminated mask M traverses the projection-optical system PL to form an image of the mask pattern on the wafer W.

In this aspect, a configuration is adopted in which the field stop 19 is positioned in proximity to the mask M. But, because the interval $i_n$ between the mask M and the field stop 19 is set so as to satisfy the conditional relations (5) or (6), the effect on the imaging performance of the projection-optical system PL of light blocked by the field stop 19 can be satisfactorily controlled. A desired configuration is one in which the field stop 19 is positioned in proximity to the mask M, which eliminates a need to insert an image-forming reflective optical system between the mask M and the field stop 19. Thus, the number of reflections in the optical path of the illumination-optical system can be decreased, light loss can be reduced, and the necessary throughput can be achieved. Further, the interval $i_n$ between the mask M and the field stop 19 is set so as to satisfy conditional relation (9). Thus, even if an integral multiple of the amount of mask-scan movement per light pulse does not exactly coincide with the width w in the scan direction of the illumination area on the mask M, a substantially uniform distribution of cumulative exposure amount on the wafer W can be obtained.

In an exposure system of this aspect, despite being a configuration in which the field stop 19 is positioned in proximity to the reflection-type mask M, the effect on the image-forming performance of the projection-optical system PL can be satisfactorily controlled, and the mask pattern can be transferred onto the wafer W accurately and with high throughput.

With the exposure system described above, the mask is illuminated using an illumination-optical system (illumination step), and photosensitive substrate is exposed with a transfer pattern defined on the mask using a projection-optical system (exposure step). Thus, microdevices (semiconductor devices, image-capture elements, liquid crystal display elements, thin-film magnetic heads, etc.) can be manufactured. The flowchart of FIG. 6 depicts an exemplary method for fabricating a semiconductor device, such as a microdevice, by forming a prescribed circuit pattern on a wafer as a photosensitive substrate, using the exposure system of this aspect.

Figure 6:
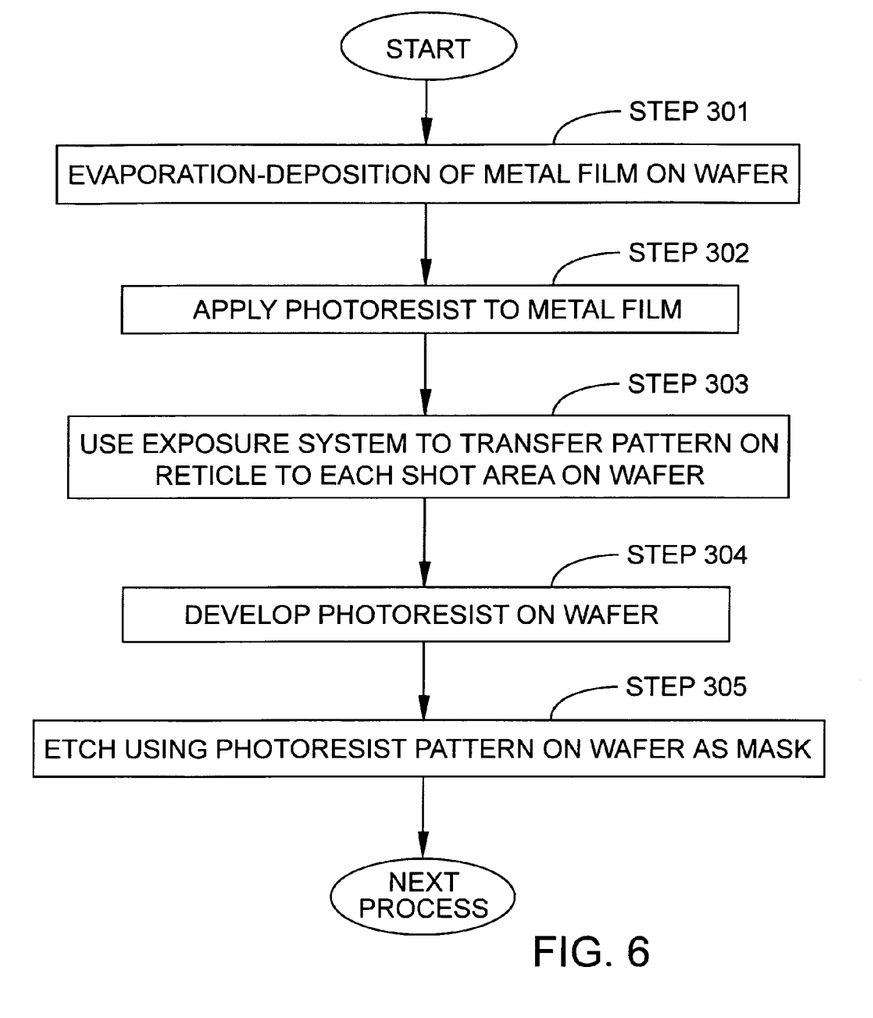
FIG. 6 shows a flowchart for one example of a method used when fabricating a semiconductor device as a microdevice.

More specifically, in step 301 of FIG. 6, a metal film is formed by evaporation deposition on one wafer lot. In the next step 302, photoresist is applied to the metal film on the wafer lot. Then, in step 303 the exposure system of this aspect is used to sequentially transfer the image of the pattern as defined on a mask (reticle) to expose individual shot areas on the wafer lot, via the projection-optical system.

In step 304 the photoresist on the wafer lot is developed, and in step 305 etching is performed using the resist pattern on the wafer lot as a mask. Thus, a circuit pattern corresponding to the pattern on the mask is formed in each shot region on the wafer. Then, by for example forming still other circuit patterns on higher layers, semiconductor devices or other devices are manufactured. Using this semiconductor-device manufacturing method, semiconductor devices having extremely fine-featured circuit patterns can be obtained with good throughput.

In the above-described aspect, a laser plasma light source is used as the light source to supply EUV light. It will be understood that the light source is not limited to such a source; other appropriate light sources can be used instead.

As explained above, in this invention a configuration is adopted in which a field stop, used for defining the illumination area on a mask, is positioned in proximity to the mask. But, the interval between the mask and the field stop is set so as to satisfy a prescribed conditional relation. Consequently, the effect of light blockage by the field stop on the image-forming performance of the projection-optical system can be satisfactorily controlled. Also, because a configuration is adopted in which the field stop is positioned in proximity to the mask, there is no need to insert an image-forming reflective optical system between the mask and field stop. Thus, the number of reflections in the optical path of the illumination-optical system can be decreased, light losses can be reduced, and the necessary throughput can be achieved.

Therefore, in exposure systems and methods as described above, despite a configuration in which a field stop is positioned in proximity to the reflection-type mask, the effect on the image-forming performance of the projection-optical system can be satisfactorily controlled, the mask pattern can be transferred onto the photosensitive substrate accurately and with high throughput, and finely detailed microdevices can be manufactured with high throughput.

The invention claimed is:

1. An exposure system, comprising:
   an illumination-optical system situated and configured to irradiate an illumination light on a reflective-type mask on which is formed a prescribed mask pattern, the illumination-optical system having a mask-side numerical aperture NA;
   a projection-optical system situated and configured to form an image of the illuminated mask pattern on a photosensitive substrate;
   the mask and the photosensitive substrate being respectively movable in a prescribed direction relative to the projection-optical system to project the illuminated mask pattern onto and expose the photosensitive substrate; and
   the illumination-optical system comprising a field stop, positioned in proximity to but separated by a distance $i_n$ from the mask and defining an illumination area on the mask, the field stop having an aperture portion having a width dimension w in a prescribed direction;
   wherein the following condition is satisfied:

$i_n < 0.5 \times w/(2 \times NA + a_n)$, wherein $a_n$ is an angle of incidence (in radians) on the mask of a principal ray of the illumination light illuminating the mask.

2. The exposure system of claim 1, wherein the following condition is satisfied:

$i_n < 0.5 \times w/(4 \times NA + a_n)$.

3. The exposure system of claim 1, wherein the distance $i_n$ between the mask and the field stop satisfies the condition:

$w/(200 \times NA) < i_n$.

4. A method for exposing a pattern, defined by a mask, onto a photosensitive substrate, the method comprising:
   irradiating illumination light onto a reflection-type mask on which is formed a prescribed mask pattern;
   while moving the mask and the photosensitive substrate relative to a projection-optical system in a prescribed direction, projecting the mask pattern through the projection-optical system onto and the photosensitive substrate so as to expose the photosensitive substrate;
   wherein the illumination step comprises (i) defining an illumination area on the mask by placing a field stop in proximity to the mask, and (ii) satisfying the following condition:

$i_n < 0.5 \times w/(2 \times NA + a_n)$, wherein $i_n$ is distance between the mask and the field stop, NA is numerical aperture of the projection-optical system on the mask side, w is a width dimension of the aperture portion of the field stop along the prescribed direction, and $a_n$ is angle of incidence (in radians) on the mask of a principal ray of the illumination light illuminating the mask.

5. The method of claim 4, wherein the following condition is satisfied:

$i_n < 0.5 \times w/(4 \times NA + a_n)$.

6. The method of claim 4, wherein $i_n$ satisfies the condition:

$w/(200 \times NA) < i_n$.

* * * * *